United States Patent
Wu et al.

(10) Patent No.: US 8,503,238 B1
(45) Date of Patent: Aug. 6, 2013

(54) ERROR RECOVERY FOR FLASH MEMORY

(75) Inventors: Yingquan Wu, Santa Clara, CA (US); Marcus Marrow, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 115 days.

(21) Appl. No.: 13/188,250

(22) Filed: Jul. 21, 2011

Related U.S. Application Data

(60) Provisional application No. 61/400,092, filed on Jul. 21, 2010, provisional application No. 61/400,116, filed on Jul. 21, 2010, provisional application No. 61/374,780, filed on Aug. 18, 2010, provisional application No. 61/374,783, filed on Aug. 18, 2010.

(51) Int. Cl.
*G11C 16/06* (2006.01)

(52) U.S. Cl.
USPC ............. 365/185.09; 365/185.24; 365/185.12

(58) Field of Classification Search
USPC ............. 365/185.09, 185.24, 185.12, 185.23, 365/185.33; 711/103
See application file for complete search history.

(56) References Cited

U.S. PATENT DOCUMENTS

| | | | | |
|---|---|---|---|---|
| 7,495,942 B2 * | 2/2009 | Davis et al. | .................. | 365/49.1 |
| 7,602,642 B2 * | 10/2009 | Choi | ........................ | 365/185.09 |
| 7,855,907 B2 * | 12/2010 | Zhu et al. | ........................ | 365/51 |
| 7,864,606 B2 * | 1/2011 | Kushnarenko | ................ | 365/201 |
| 8,345,477 B1 * | 1/2013 | Yang | ........................ | 365/185.03 |

* cited by examiner

*Primary Examiner* — David Lam
(74) *Attorney, Agent, or Firm* — Van Pelt, Yi & James LLP

(57) ABSTRACT

A system for error recovery for flash memory comprises a receiver and an interface. The receiver is configured to receive a portion of data. The receiver is further configured to identify a logical type of the portion of data. The receiver is further configured to adjust a threshold for error recovery of the portion of data based at least in part on the logical type. The receiver is further configured to read the portion of data using the adjusted threshold. The interface is coupled to the receiver.

19 Claims, 15 Drawing Sheets

ERROR RECOVERY FOR FLASH MEMORY

CROSS REFERENCE TO OTHER APPLICATIONS

This application claims priority to U.S. Provisional Patent Application No. 61/400,092 entitled GENERIC ERROR RECOVERY FOR FLASH MEMORY filed Jul. 21, 2010 which is incorporated herein by reference for all purposes; and claims priority to U.S. Provisional Patent Application No. 61/400,116 entitled FAST ERROR RECOVERY FOR FLASH MEMORY filed Jul. 21, 2010 which is incorporated herein by reference for all purposes; and claims priority to U.S. Provisional Patent Application No. 61/374,780 entitled GENERIC ERROR RECOVERY FOR FLASH MEMORY filed Aug. 18, 2010 which is incorporated herein by reference for all purposes; and claims priority to U.S. Provisional Patent Application No. 61/374,783 entitled FAST ERROR RECOVERY FOR FLASH MEMORY filed Aug. 18, 2010 which is incorporated herein by reference for all purposes.

BACKGROUND OF THE INVENTION

Program-erase (PE) cycling in conjunction with data retention causes drift of cell voltage levels in flash memory. When a cell level significantly drifts to cross the corresponding default threshold, the normal read operation using the default thresholds will return a false level. When the number of corrupted cells is beyond the capability of error-correction codes, the page is declared a failure. It would therefore be desirable to have error recovery for flash memory.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
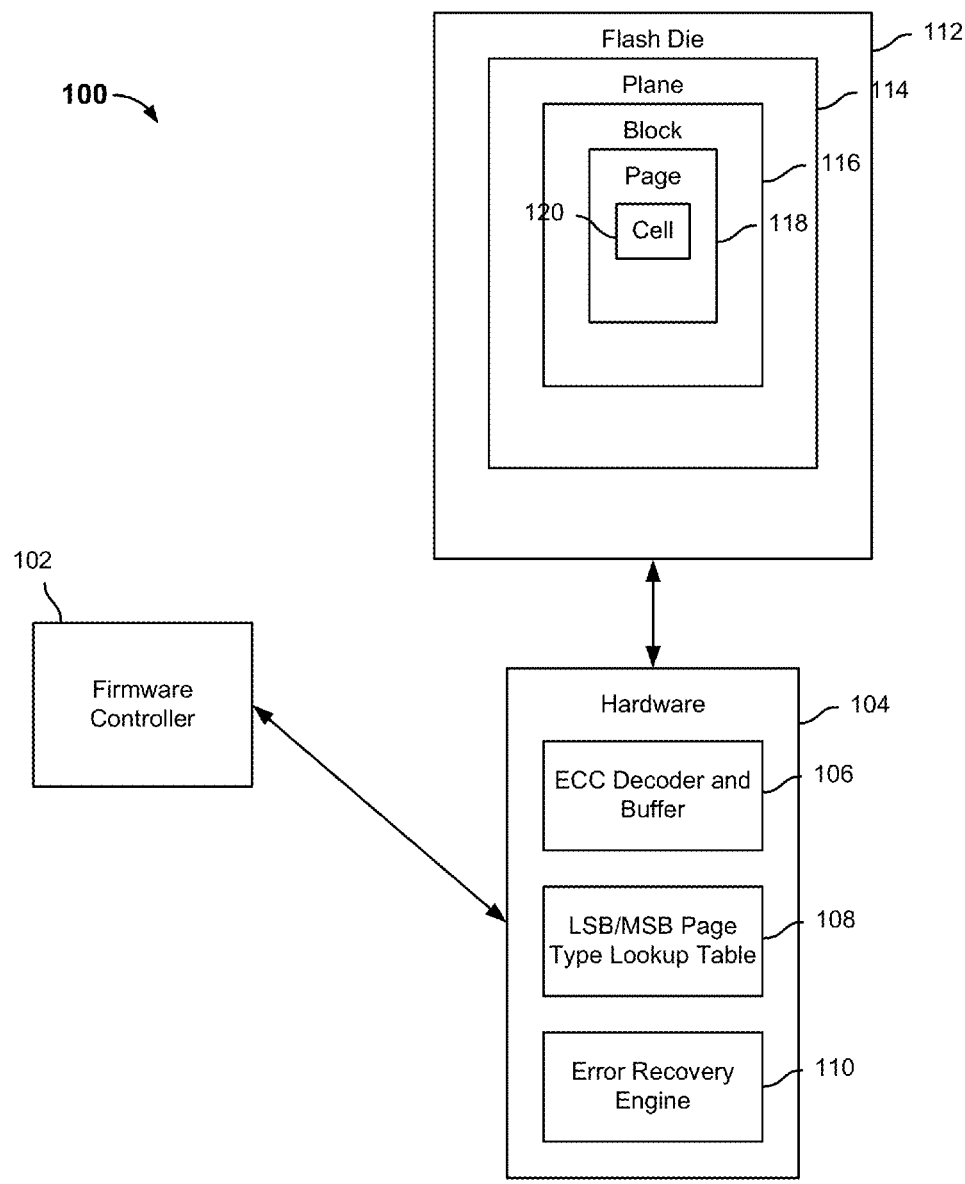
FIG. 1 is a block diagram illustrating an embodiment of a system for error recovery for flash memory.

FIG. 1 is a block diagram illustrating an embodiment of a system for error recovery for flash memory. In the example shown, system 100 is shown to include firmware controller 102, hardware 104, and flash die 112. Hardware 104 is further shown to include error-correcting code (ECC) decoder and buffer 106. Least significant bit/most significant bit (LSB/MSB) page type lookup table 108, and error recovery engine 110. Flash die 112 is further shown to include plane 114. Plane 114 is further shown to include flash memory block 116. Flash memory block 116 is further shown to include page 118. Page 118 is further shown to include cell 120.

In some embodiments, firmware controller 102 is configured to transmit commands to hardware 104. In various embodiments, commands comprise commands to read a page, perform decoding for reading a page, or any other appropriate commands. In some embodiments, firmware controller 102 is configured to receive information from hardware 104. For example, firmware controller 102 receives a page of data or any other appropriate information from hardware 104. In some embodiments, firmware controller 102 is configured to assist hardware 104. For example, firmware controller 102 assists hardware 104 in error recovery or any other appropriate process.

In some embodiments, hardware 104 is configured to execute commands received from firmware controller 102. In some embodiments, hardware 104 is configured to communicate with flash die 112. In some embodiments, hardware 104 receives information from flash die 112. For example, hardware 104 receives a page of data from flash die 112, associated page number, or any other appropriate information. In some embodiments, a page number comprises a number identifying a specific physical page of a block of flash memory.

In some embodiments, ECC decoder and buffer 106 of hardware 104 is configured to receive a page of data. In some embodiments, the page of data is encoded. In some embodiments, encoding is performed using an ECC code, for example, a BCH code, or any other appropriate encoding scheme. In some embodiments, a codeword is generated based at least in part on an encoded page of data. In some embodiments, ECC decoder and buffer 106 reads a codeword associated with the page of data and the associated page of data is decoded and recovered.

In some embodiments, in the event that a codeword is not read successfully by ECC decoder and buffer 106, error recovery engine 110 is invoked. In error recovery mode, the main objective is to successfully recover data, while operation latency is a secondary concern. In some embodiments, error recovery comprises recovering corrupted data. In some embodiments, successfully recovering data comprises successfully reading a codeword.

In some embodiments, LSB/MSB page type lookup table 108 of hardware 104 is configured to receive a page number, perform a lookup based at least in part on the page number, and output an indication of whether the physical page corresponding to the page number is of LSB logical page type or MSB logical page type. In various embodiments, LSB/MSB page type lookup table 108 is provided by a flash memory manufacturer, is determined experimentally, or is provided in any other appropriate manner. For example, a lookup table is determined experimentally by first writing golden, or known data, to flash memory. An MSB or LSB read threshold voltage, which will be described more fully below, is then adjusted. In the event that an MSB read threshold voltage is adjusted, pages of the flash memory are read, and those pages with significant changes in the number of bit errors are indicated to be MSB pages. The remaining pages are indicated to be LSB pages. In the event that an LSB read threshold is adjusted, pages of the flash memory are read, and those pages with significant changes in the number of bit errors are indicated to be LSB pages. The remaining pages are indicated to be MSB pages. In some embodiments, a significant change in the number of bit errors comprises a threshold number of changes in the number of bit errors.

In various embodiments, system 100 may be different from the configuration depicted. For example, one or more components (and associated processes) may be performed by any combination of hardware, firmware, and/or software. For example, the various processes described herein may be performed by hardware (e.g., hardware 104), firmware (e.g., firmware controller 102), and/or software. In various embodiments a receiver portion of system 100 comprises firmware controller 102 and hardware 104. The receiver portion is configured to receive or read data from flash die 112 via an interface. In various embodiments, the receiver portion and/or system 100 resides on one or more chips.

Figure 2:
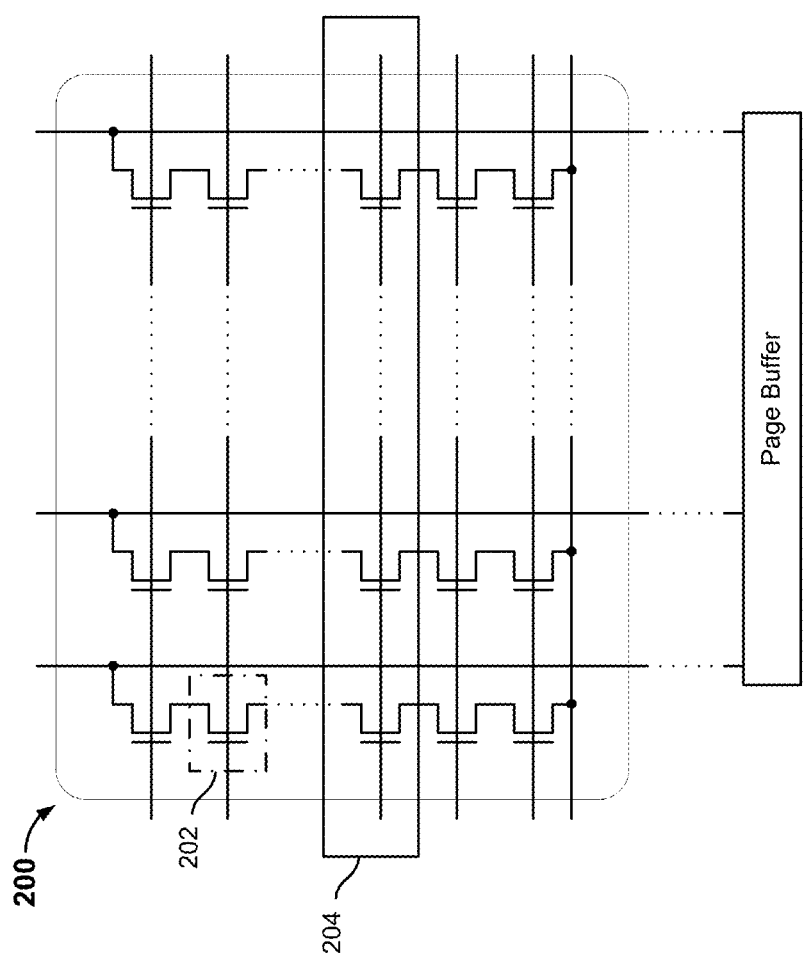
FIG. 2 is a diagram illustrating an embodiment of a hardware representation of a block of flash memory.

FIG. 2 is a diagram illustrating an embodiment of a hardware representation of a block of flash memory. In some embodiments, the block of flash memory is used to implement block 116 of FIG. 1. In the example shown, block 200 comprises cell 202 (dash-dot box) and hardware page 204 (horizontal solid box).

In some embodiments, cell 202 comprises an n-bit, multi-level cell. For example, in some embodiments, cell 202 comprises a two-bit cell. In some embodiments, cell 202 is implemented using a floating gate MOSFET. In some embodiments, an n-bit cell stores $2^n$ levels. In some embodiments, the n-bit cell is a one-bit cell, two-bit cell, three-bit cell, or any other appropriate n-bit cell. In some embodiments, data stored in a cell is read by applying read threshold currents corresponding to each of the levels. In some embodiments, read threshold voltages are applied. In some embodiments, threshold currents are related with corresponding threshold voltages through a relationship. For example, a threshold current is related with a corresponding threshold voltage through a linear relationship, or any other appropriate relationship. In some embodiments, threshold voltages comprise default threshold voltages.

Figure 3:
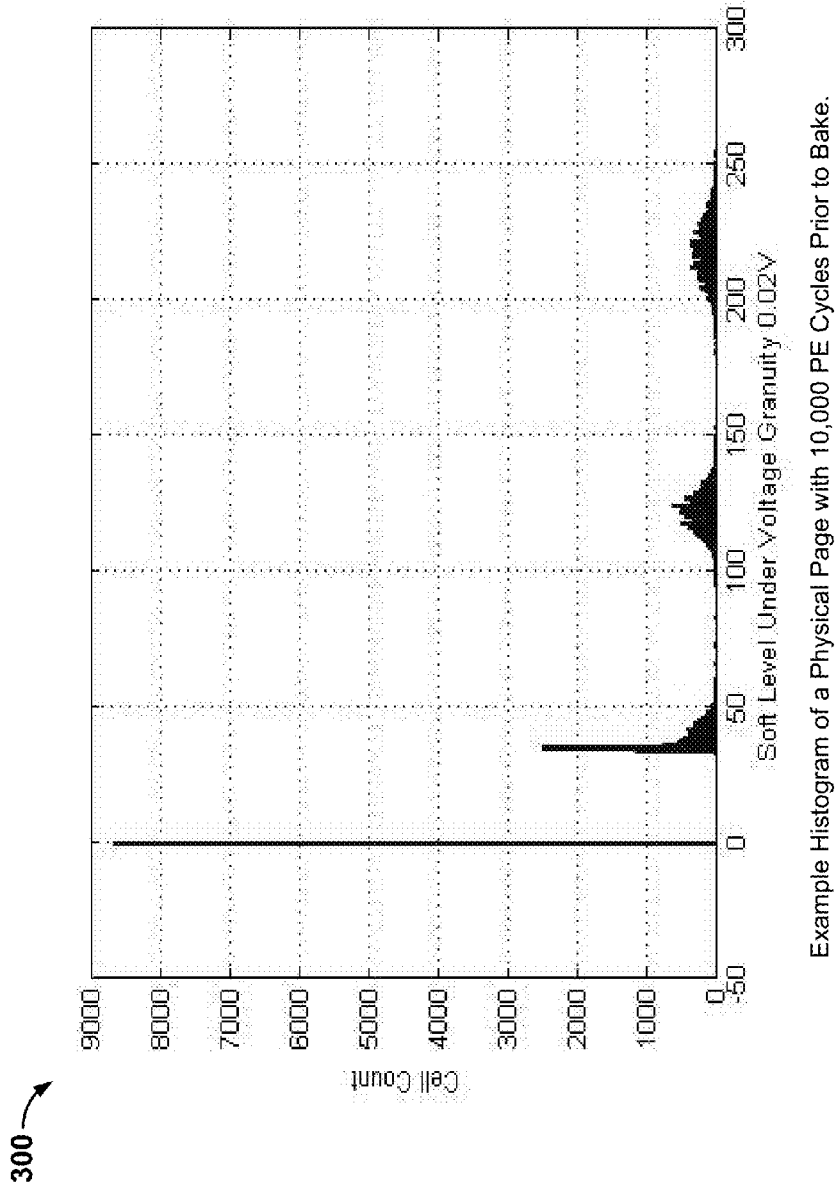
FIG. 3 is a diagram illustrating an embodiment of a histogram of a physical page with 10,000 PE cycles prior to baking.

FIG. 3 is a diagram illustrating an embodiment of a histogram of a physical page with 10,000 PE cycles prior to baking In the example shown, histogram 300 is a histogram of soft level voltage (x-axis) versus number of cells read at that voltage (y-axis). In the example shown, the physical page comprises two-bit cells.

Figure 4:
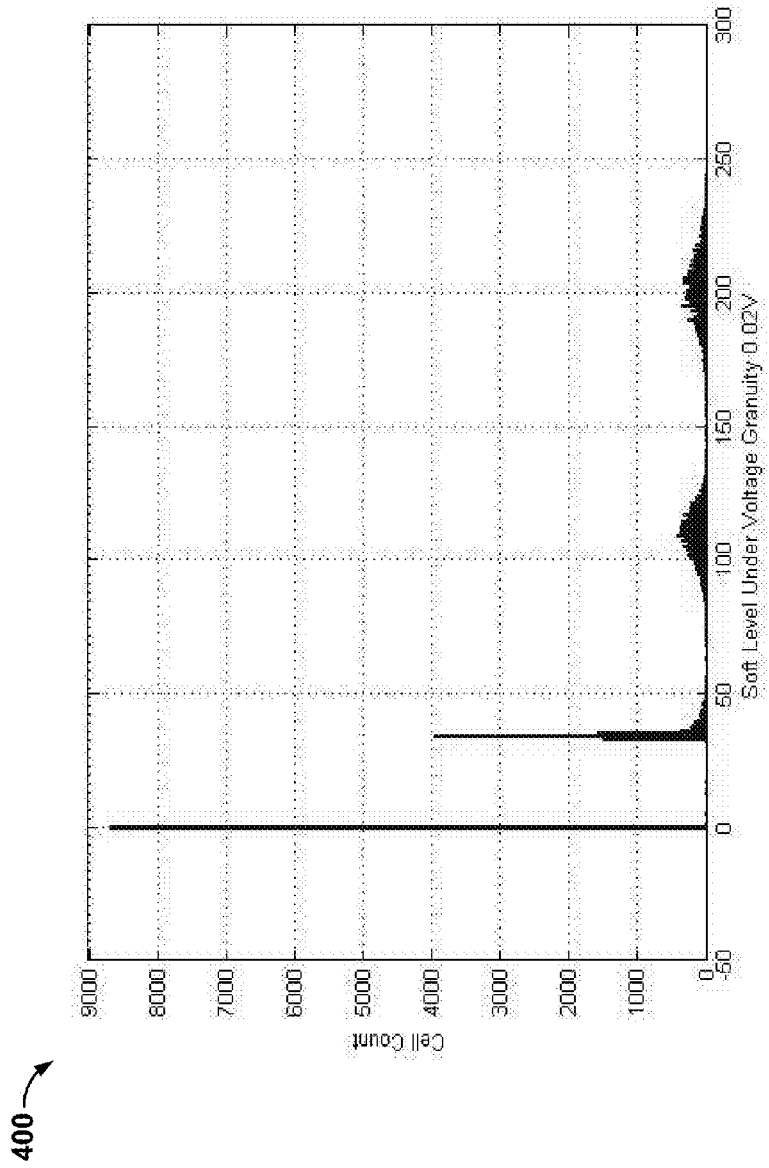
FIG. 4 is a diagram illustrating an embodiment of a histogram of a physical page with 10,000 PE cycles after 10 hours of baking at 125 degrees Celsius.

FIG. 4 is a diagram illustrating an embodiment of a histogram of a physical page with 10,000 PE cycles after 10 hours of baking at 125 degrees Celsius. In the example shown, histogram 400 is a histogram of soft level voltage (x-axis) versus number of cells read at that voltage (y-axis). In the example shown, the physical page shown corresponds to the physical page shown in FIG. 3 after baking In some embodiments, 10 hours of baking at 125 degrees Celsius represents one-year retention.

In the examples shown, FIGS. 3 and 4 illustrate drift of cell voltage levels caused at least in part by program-erase (PE) cycling in conjunction with data retention.

In some embodiments, in the event that a cell voltage level significantly drifts to cross the corresponding default threshold voltage, the normal read operation using the default threshold voltage returns a false level. In some embodiments, in the event that the number of corrupted cells is beyond the capability of error-correction codes, such as BCH codes or any other appropriate code, a page is declared a failure and error recovery is invoked. For example, error recovery engine 110 of FIG. 1 is invoked. In some embodiments, error recovery is performed by adjusting read threshold voltages for re-reads until either a successful read (e.g., ECC is successful) has occurred or a maximum number of re-reads has been reached.

In some embodiments, the n-bits of a cell such as cell 202 of FIG. 2 belong to different pages. For example, in a two-bit cell, in some embodiments, the two bits of the cell belong to different pages, for example, LSB page and MSB page, respectively. In some embodiments, a grey map is employed for the leveling map in order to minimize the bit-error-rate (BER).

Figure 5A:
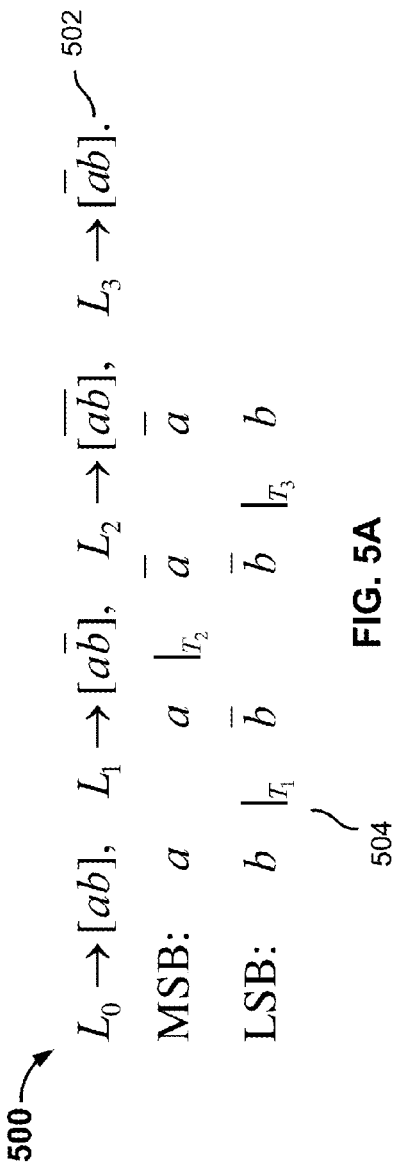
FIG. 5A is a diagram illustrating an embodiment of a two-bit grey map of a first type.

FIG. 5A is a diagram illustrating an embodiment of a two-bit grey map of a first type. In the example shown, grey map 500 is shown to include levels 502 ($L_0$, $L_1$, $L_2$, and $L_3$) and threshold voltages 504 ($T_1$, $T_2$, and $T_3$).

Figure 5B:
FIG. 5B is a diagram illustrating an embodiment of a two-bit grey map of a second type.

FIG. 5B is a diagram illustrating an embodiment of a two-bit grey map of a second type. In the example shown, grey map 501 is shown to include levels 503 ($L_0$, $L_1$, $L_2$, and $L_3$) and threshold voltages 505 ($T_1$, $T_2$, and $T_3$).

In map 500 of FIG. 5A and map 501 of FIG. 5B, [ab] (a, b $\in\{0,1\}$) denotes two bits of a cell, where a is the MSB and b is the LSB. $\bar{a}$ denotes the flip of a, i.e., $0\rightarrow1$ or $1\rightarrow0$. $L_i$, i=0, 1, 2, 3, denote four levels.

For exemplary purposes, a two-bit-per-cell flash memory using a two-bit grey map of the first type (e.g., grey map 500 of FIG. 5A) will be discussed throughout. However, in various embodiments a one-bit-per cell (e.g., single-level cell SLC), 3-bit-per-cell, or any other appropriate n-bit-per-cell flash memory using any appropriate corresponding n-bit grey or other mapping can be used with appropriate adaptation.

In the example two-bit grey map of the first type (e.g., grey map 500 of FIG. 5A), the least significant bit (LSB), b, is exclusively controlled by the first and the third voltage thresholds, $T_1$ and $T_3$, whereas the most significant bit (MSB) a, is exclusively controlled by the second voltage threshold, $T_2$. On the other hand, in the example two-bit grey map of the first type (501 of FIG. 5B), the LSB is exclusively controlled by $T_2$, whereas the MSB is exclusively controlled by $T_1$ and $T_3$.

Figure 6:
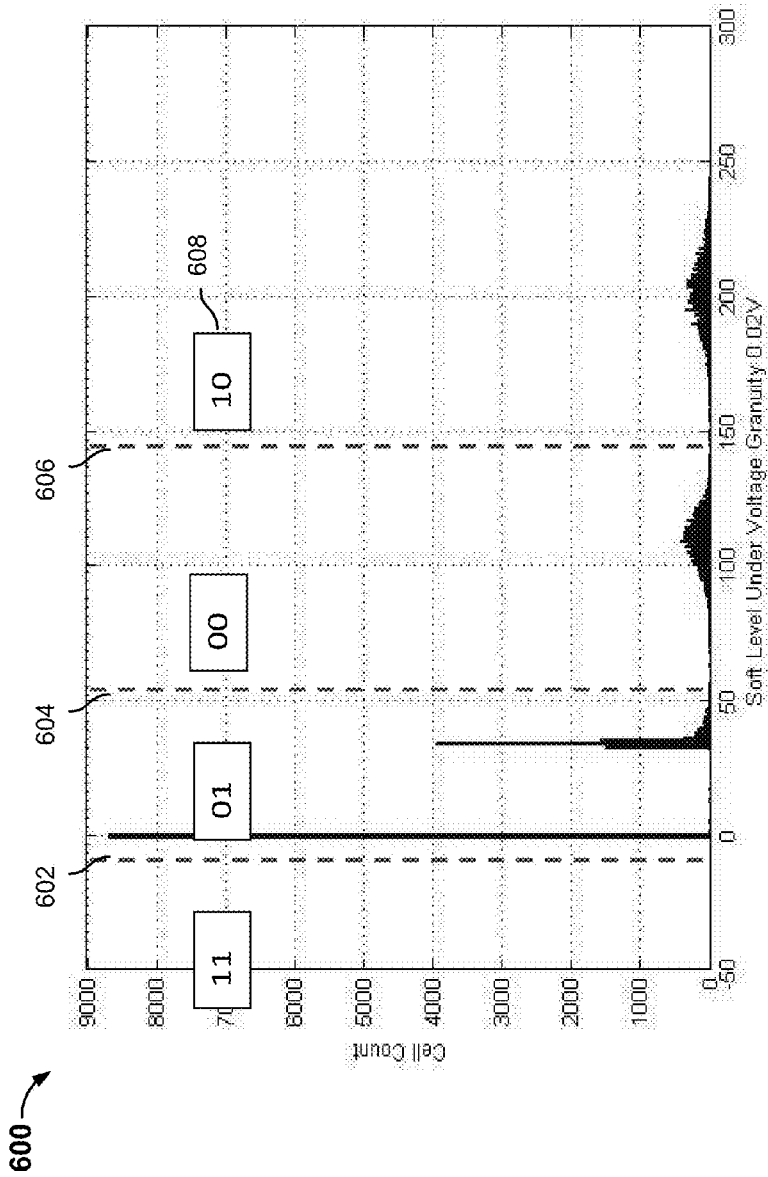
FIG. 6 is a diagram illustrating an embodiment of a histogram depicting an example grey mapping of two bits into four levels of a flash memory.

FIG. 6 is a diagram illustrating an embodiment of a histogram depicting an example grey mapping of two bits into four levels of a flash memory. In the example shown, histogram 600 is shown to include threshold voltage $T_1$ 602, threshold voltage $T_2$ 604, threshold voltage $T_3$ 606, and levels 608 (11, 01, 00, 10). In the example shown, the grey mapping used is that of the first type (500 of FIG. 5A).

Figure 7:
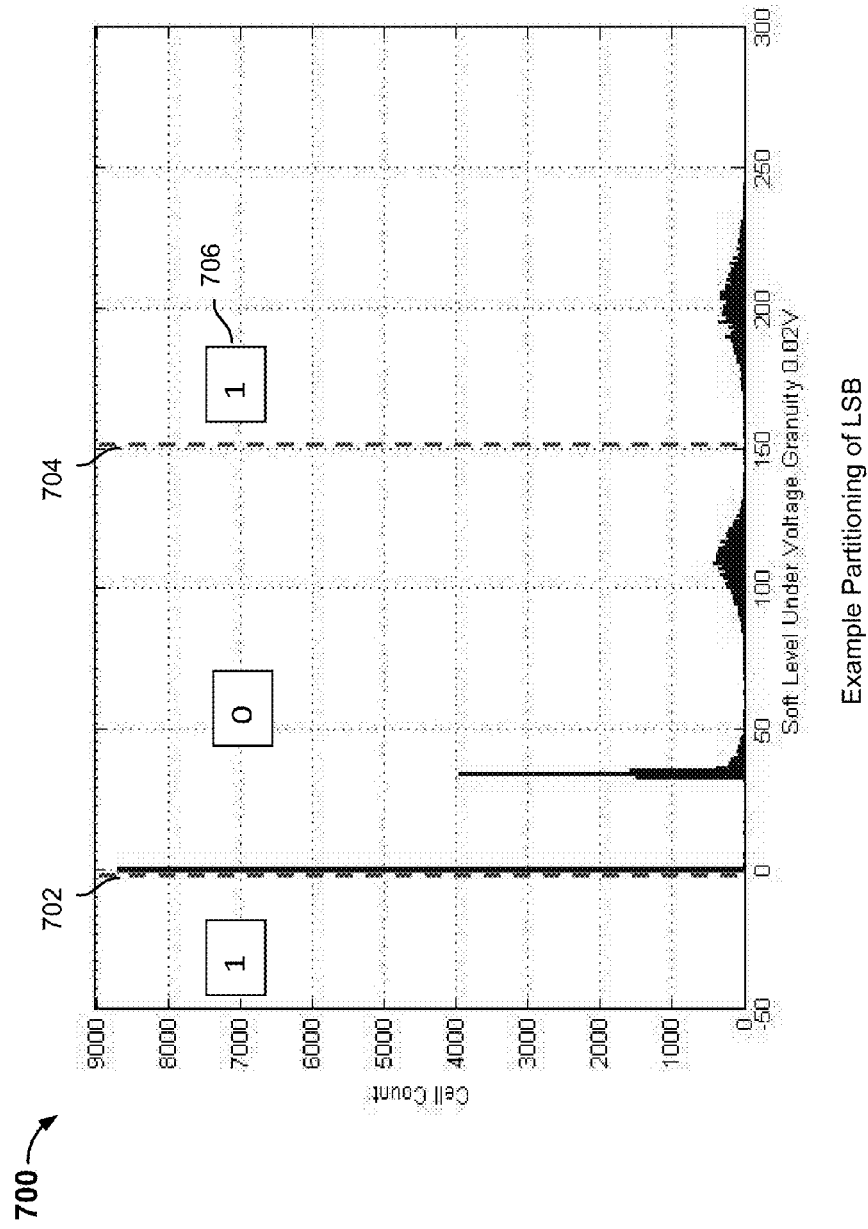
FIG. 7 is a diagram illustrating an embodiment of a histogram depicting an example partitioning of LSB.

FIG. 7 is a diagram illustrating an embodiment of a histogram depicting an example partitioning of LSB. In the example shown, histogram 700 is shown to include threshold voltage $T_1$ 702, threshold voltage $T_3$ 704, and least significant bits 706 (1, 0, 1). In some embodiments, threshold voltage $T_1$ 702 and threshold voltage $T_3$ 704 correspond to threshold voltage $T_1$ 602 and threshold voltage $T_3$ 606 of FIG. 6, respectively. In some embodiments, least significant bits 706 correspond to the least significant bits of levels 608 of FIG. 6.

In histogram 700, in some embodiments, the LSB of a cell is determined to be 0 if the detected voltage is greater than threshold voltage $T_1$ 702 and less than or equal to threshold voltage $T_3$ 704, or 1 otherwise.

Figure 8:
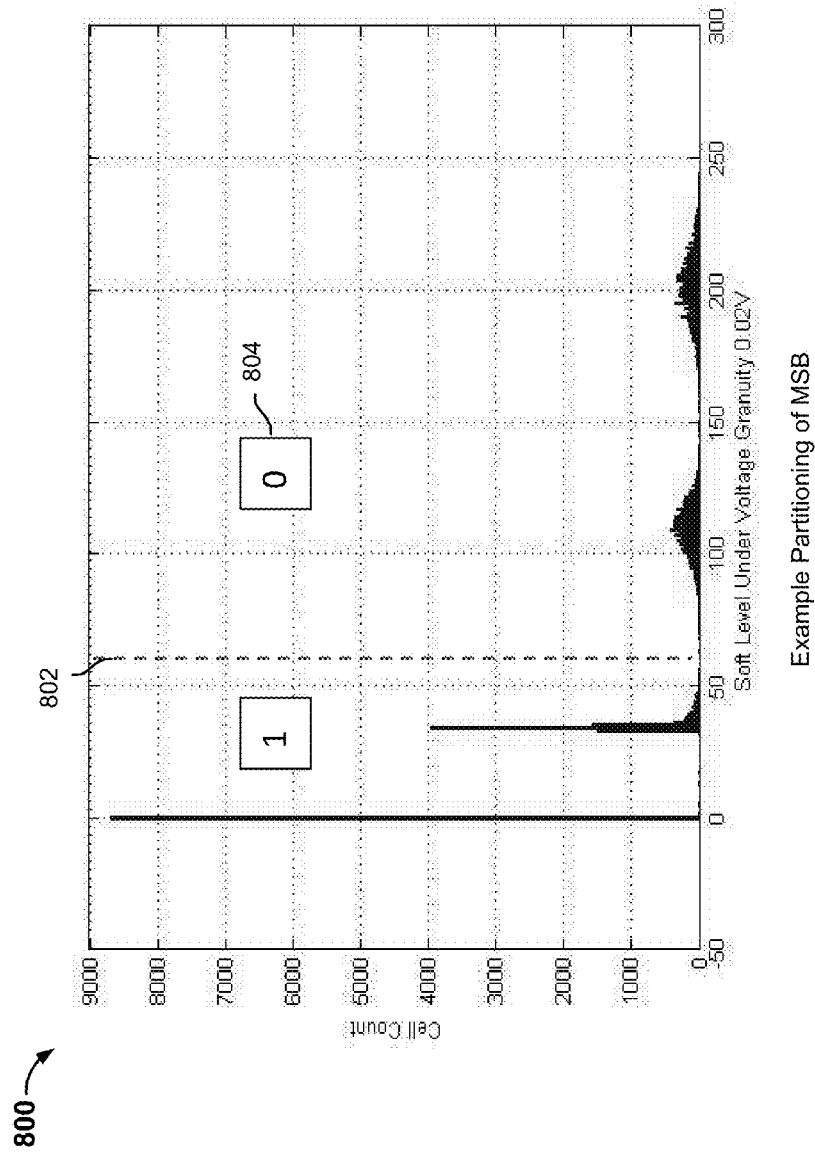
FIG. 8 is a diagram illustrating an embodiment of a histogram depicting an example partitioning of MSB.

FIG. 8 is a diagram illustrating an embodiment of a histogram depicting an example partitioning of MSB. In the example shown, histogram 800 is shown to include threshold voltage $T_2$ 802 and most significant bits 804 (1, 0). In some embodiments, threshold voltage $T_2$ 802 corresponds to threshold voltage $T_2$ 604 of FIG. 6. In some embodiments, most significant bits 804 correspond to the most significant bits of levels 608 of FIG. 6.

In histogram 800, in some embodiments, the MSB of a cell is determined to be 0 if the detected voltage is greater than the second threshold $T_2$, or 1 otherwise.

Figure 9:
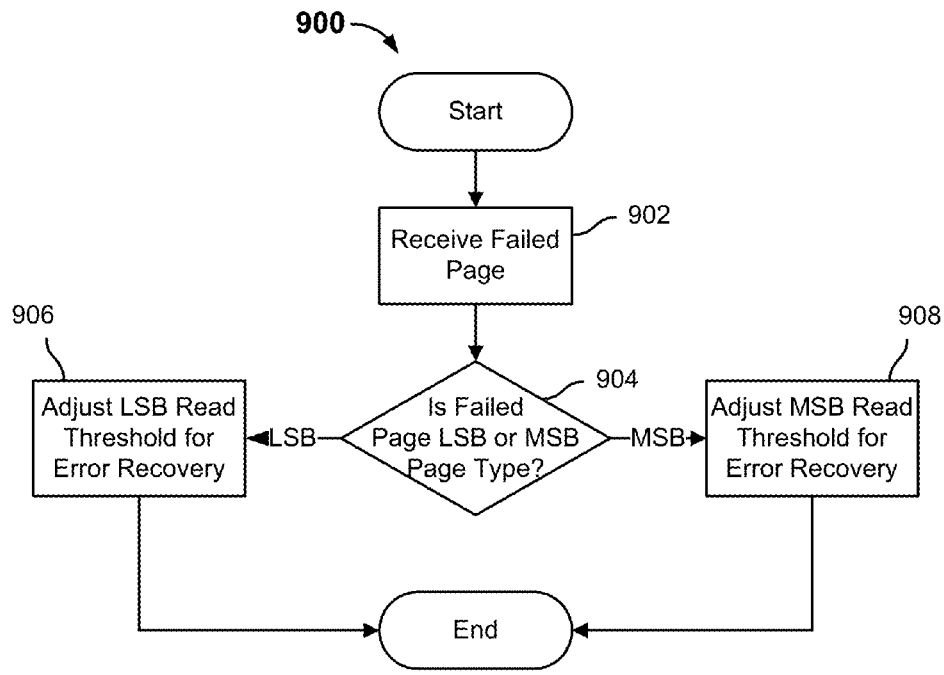
FIG. 9 is a flow diagram illustrating an embodiment of a process for error recovery for flash memory.

FIG. 9 is a flow diagram illustrating an embodiment of a process for error recovery for flash memory. In some embodiments, the process of FIG. 9 is executed by error recovery engine 110 of FIG. 1. In the example shown, in 902, a failed page is received. In some embodiments, a failed page comprises a page, wherein the number of corrupted cells of the page is beyond the capability of error-correction codes. In some embodiments, a page is determined to be a failure after a failed reading using a default threshold voltage. In some embodiments, a failed reading comprises failing to read a codeword successfully.

In 904, it is determined whether the failed page is an LSB page or an MSB page type. In various embodiments, the page type of the failed page is determined using a LSB/MSB page type lookup table such as LSB/MSB page type lookup table 108 of FIG. 1, or through any other appropriate means.

In the event that the failed page is an LSB page, in 906, error recovery using LSB threshold adjustment is determined. In the event that the failed page is an MSB page, in 908, error recovery using MSB threshold adjustment is determined.

Figure 10:
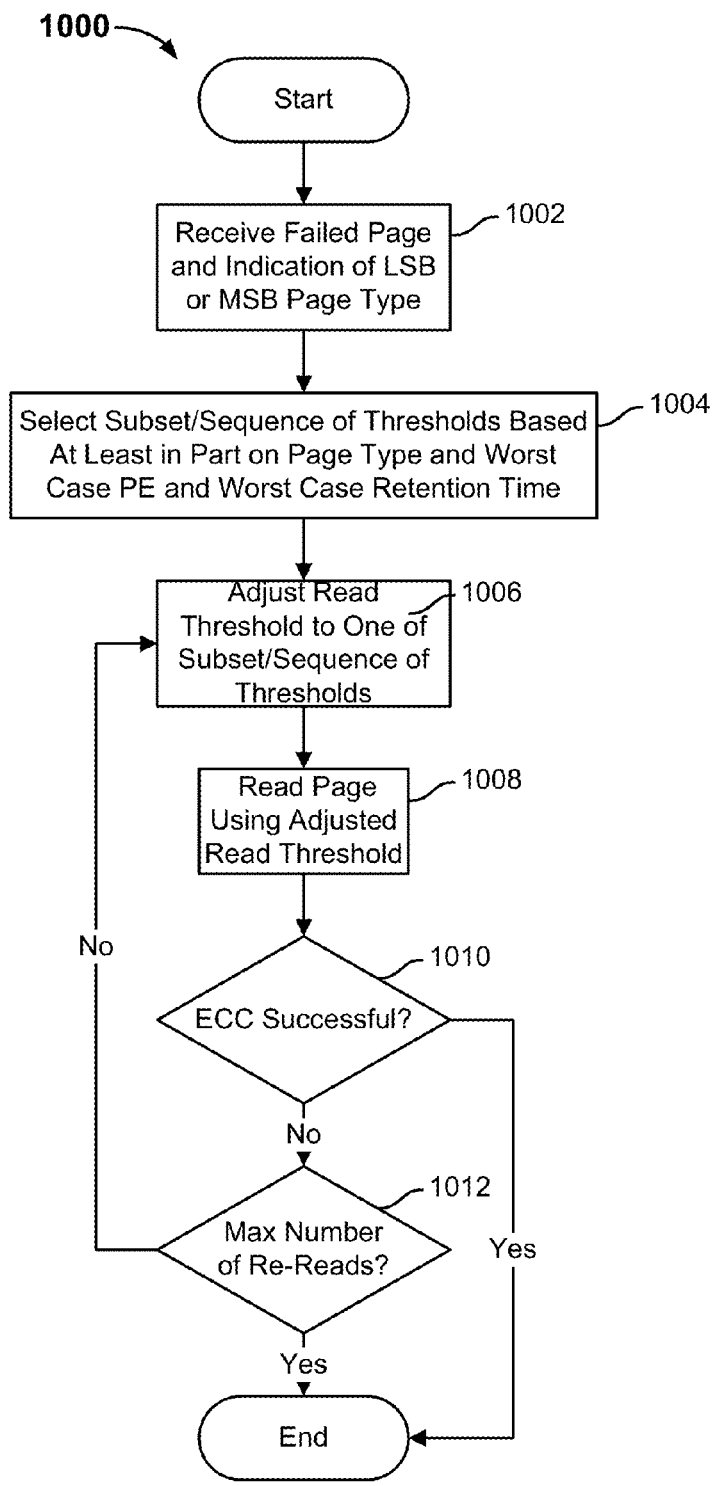
FIG. 10 is a flow diagram illustrating an embodiment of a process for generic error recovery for flash memory.

FIG. 10 is a flow diagram illustrating an embodiment of a process for generic error recovery for flash memory. In some embodiments, the process of FIG. 10 is used to implement process step 906 and/or 908 of FIG. 9. In the example shown, in 1002, a failed page and an indication of LSB or MSB page type are received.

In 1004, a subset/sequence of thresholds is selected based at least in part on page type. In 1006, a threshold for reading the failed page is adjusted based at least in part on the subset/sequence of thresholds.

In an example where a grey mapping such as the grey mapping 500 of FIG. 5A is used, in the event a failed page is indicated to be of MSB page type, then the second threshold voltage $T_2$ (e.g., threshold voltage $T_2$ 802 of FIG. 8) is adjusted iteratively, following a pre-determined sequence, or any other appropriate adjustment scheme, until the failed page is successfully read, or the maximum read count is reached (e.g., timed out). For example, an adjustment sequence comprises:

$$T_2 = T_2 - \lfloor id_2 \rfloor, i \in \lfloor f_{2,min}, f_{2,max} \rfloor$$

where $T_2^{def}$ denotes the chip default threshold voltage value for $T_3$, $d_2$ denotes the granularity, and $f_{2,min}$ and $f_{2,max}$ are pre-determined values. In various embodiments, the granularity $d_2$ comprises a rational number, or any other appropriate granularity. In various embodiments, $f_{2,min}$ and $f_{2,max}$ are pre-determined values based at least in part on experimental simulation and measurement, such as a worst case number of program-erase (PE) cycles, a worst case retention time, or any other appropriate criteria.

Continuing with the example where a grey mapping such as the grey mapping 500 of FIG. 5A is used, in the event that a failed page is indicated to be of LSB page type, then the first and third threshold voltages, $T_1$ and $T_3$ (e.g., threshold voltage $T_1$ 702 and threshold voltage $T_1$ 704 of FIG. 7) are adjusted iteratively, following a pre-determined sequence, or any other appropriate adjustment scheme, until the failed page is successfully read, or the maximum read count is reached (e.g., timed out).

It is observed that in some embodiments, $T_1 = 0$ is the most likely optimal threshold (e.g., in the minimizing bit-error-rate sense) in data retention mode. Therefore, in some embodiments, $T_1$ is chosen from and based at least in part on a fixed sequence where $$T_1 = \lfloor f_{1,max} d_1 \rfloor, \lfloor (f_{1,max}-1)d_1 \rfloor, \ldots, \lfloor d_1 \rfloor, 0$$

where $d_1$ denotes the granularity and $f_{1,max}$ denotes a given maximum value. In various embodiments, the granularity $d_1$ comprises a rational number, or any other appropriate granularity. In some embodiments, the sequence is independent of the original threshold voltage value of $T_1$. In various embodiments, the original threshold voltage value comprises a default threshold voltage value, or any other appropriate threshold voltage value. In some embodiments, $T_3$ is adjusted in the same manner as $T_2$, with a sequence of $$T_3 = T_3^{def} - \lfloor id_3 \rfloor, i \in \lfloor f_{3,min}, f_{3,max} \rfloor$$

where $T_3^{def}$ denotes a chip default threshold voltage value for $T_3$, $d_3$ denotes the granularity, and $f_{3,min}$ and $f_{3,max}$ are pre-determined values. In various embodiments, the granularity $d_3$ comprises a rational number, or any other appropriate granularity. In various embodiments, $f_{3,min}$ and $f_{3,max}$ are pre-determined values based at least in part on experimental simulation and measurement, a worst case number of program-erase (PE) cycle, a worst case retention time, or any other appropriate criteria. In some embodiments, $T_1$ and $T_3$ are strongly correlated due to the fact that all levels suffer identical PE cycling and time retention. Therefore, in some embodiments, it is plausible to set $$f_{1,max} = f_{3,max} - f_{3,min}$$

and adjust $T_1$ and $T_3$ synchronically.

In 1008, the failed page is read using the adjusted threshold. In 1010, it is determined whether the failed page is read successfully. In the event that the failed page is read successfully, the process ends. In the event that the failed page is not read successfully, in 1012, it is determined whether a maximum number of re-reads have been performed. In the event that a maximum number of re-reads have been performed, the process ends. In the event that a maximum number of re-reads have not been performed, the process returns to 1006. In various embodiments, the threshold voltages are adjusted iteratively, following a pre-determined sequence, or any other appropriate adjustment scheme, until the failed page is successfully read, or the maximum read count is reached (e.g., timed out). In some embodiments, a successful read comprises a successful read of a codeword. In some embodiments, generic error recovery process 1000 is performed for an n-bit-per-cell flash memory using an appropriate grey level mapping scheme.

In the above paragraphs, an embodiment of a process for generic error recovery for a flash memory has been described. In the above paragraphs, it was shown that only a subset of all possible combinations of thresholds needs to be tuned to re-read a page, without compromising performance. In the two-bit multi-level-cell (MLC) example used above, the maximum number of re-reads is q (e.g., MSB case with threshold voltage $T_2$) or $q^2$ (e.g., LSB case with threshold voltage $T_1$ and threshold voltage $T_3$ and combinations thereof), depending on the page type of the logical page, where q denotes the number of threshold voltage tuning levels. This achieves a significant reduction in complexity as compared to a brute force search of $q^3$ re-reads (e.g., threshold voltages $T_1$. $T_2$, and $T_3$ and combinations thereof are used for reading). However, a large amount of re-tries is still required in even the above generic error recovery process in order to achieve near-optimal performance for large q (e.g., q=256 for typical applications). It would therefore be desirable to have a process for fast error recovery that can achieve near-optimal performance using a significantly reduced number of re-reads.

In the following paragraphs, a process for fast error recovery for flash memory that achieves near-optimal performance within four re-reads by approximating distributions of voltage levels with Gaussian distributions is described. For illustrative purposes, the two-bit-per-cell grey mapping of the first type (e.g., grey mapping 500 of 5A) described in the above paragraphs is further used below. However, in various embodiments, the error recovery process described below can be adapted and applied to n-bit-per-cell flash memory. For example, the error recovery process can be adapted and applied to a one-bit-per-cell, three-bit-per-cell, or any other appropriate n-bit-per-cell flash memory.

Figure 11:
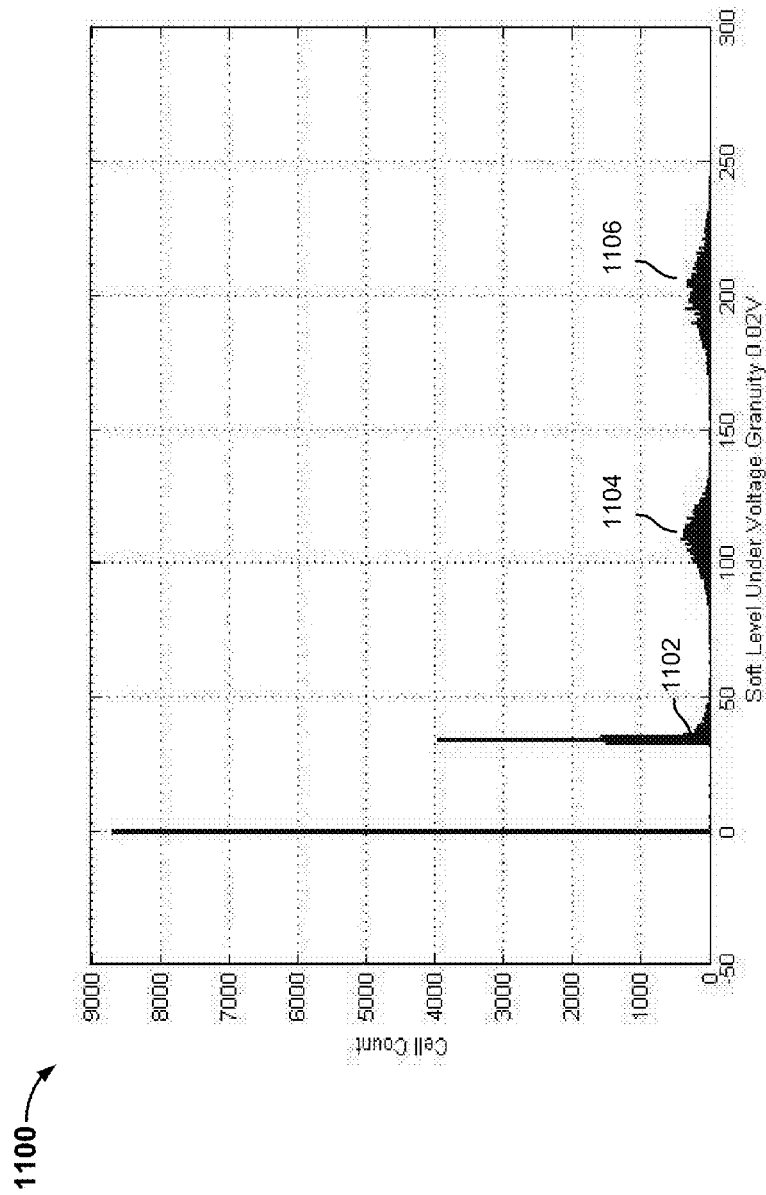
FIG. 11 is a diagram illustrating an embodiment of a histogram of a physical page with 10,000 PE cycles after 10 hours of baking at 125 degrees Celsius.

FIG. 11 is a diagram illustrating an embodiment of a histogram of a physical page with 10,000 PE cycles after 10 hours of baking at 125 degrees Celsius. In the example shown, histogram 1100 is shown to include distribution of voltage level 1 1102, distribution of voltage level 2 1104, and distribution of voltage level 3 1106. In the example shown, histogram 1100 is a histogram of soft level voltage (x-axis) versus number of cells read at that voltage (y-axis). In the example shown, the physical page depicted corresponds to the physical page depicted in FIG. 3 after baking.

In the example histogram 1100, it is indicated that the distribution of level 2 1104 and the distribution of level 3 1106 are suitably approximated by Gaussian distributions. In some embodiments, the right side distribution of voltage level 1 1102 is suitably approximated by a Gaussian tail. More importantly, it is plausibly assumed that the default threshold voltages $T_2^{def}$ and $T_3^{def}$ never cross their boundaries defined by the two means of the adjacent (Gaussian) distributions (e.g., mean of distribution of level 3 1208 and/or mean of distribution of level 2 1210 of FIG. 12A).

Figure 12A:
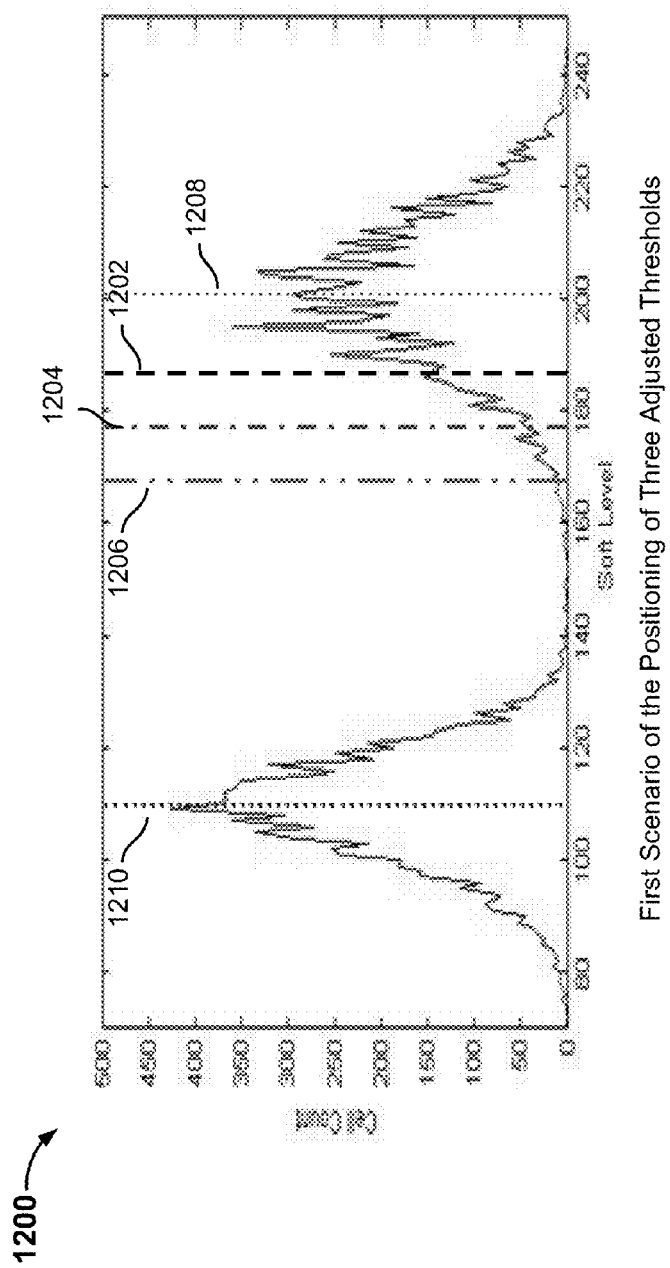
FIG. 12A is a diagram illustrating an embodiment of a histogram of a first scenario of the positioning of three adjusted thresholds.

FIG. 12A is a diagram illustrating an embodiment of a histogram of a first scenario of the positioning of three adjusted thresholds. In the example shown, histogram 1200 is shown to include default threshold voltage 1202 (dash line), first determined and modified threshold voltage 1204 (dash dot line), second determined and modified threshold voltage 1206 (dash dot dot line), mean of distribution of level 3 1208, and mean of distribution of level 2 1210. In the example shown, histogram 1200 is a histogram of soft level voltage (x-axis) versus number of cells read at that voltage (y-axis).

Figure 12B:
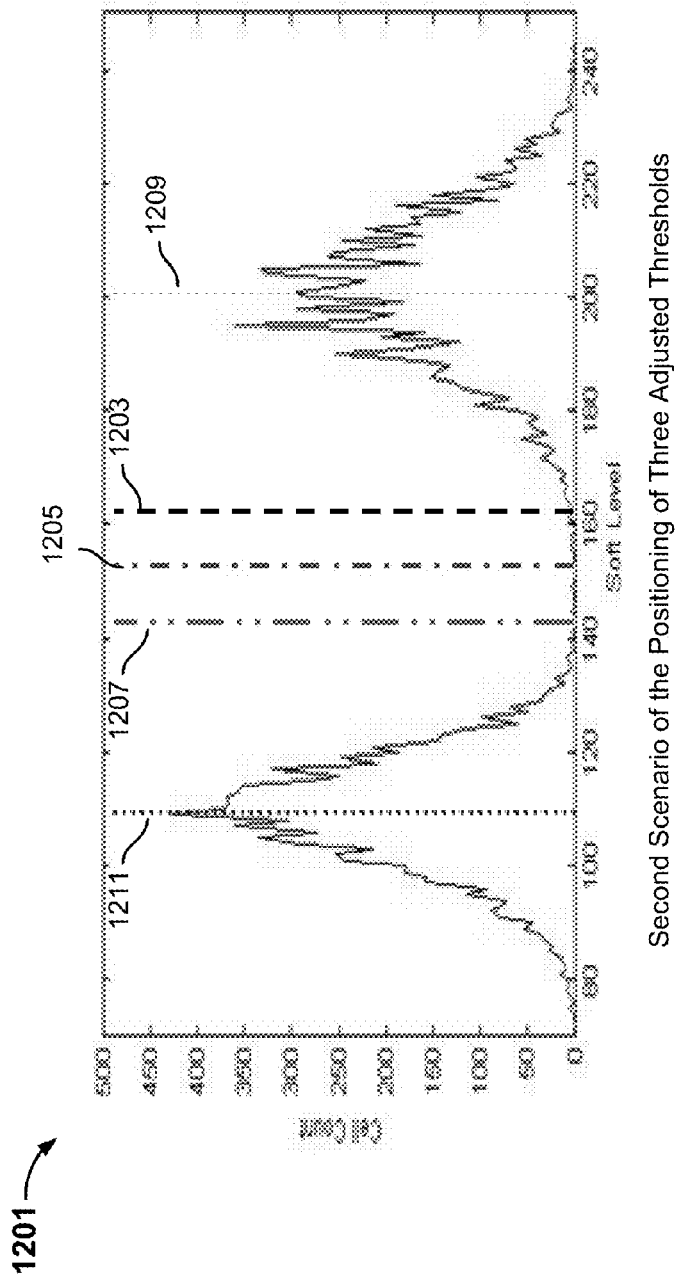
FIG. 12B is a diagram illustrating an embodiment of a histogram of a second scenario of the positioning of three adjusted thresholds.

FIG. 12B is a diagram illustrating an embodiment of a histogram of a second scenario of the positioning of three adjusted thresholds. In the example shown, histogram 1201 is shown to include default threshold voltage 1203 (dash line), first determined and modified threshold voltage 1205 (dash dot line), second determined and modified threshold voltage 1207 (dash dot dot line), mean of distribution of level 3 1209, and mean of distribution of level 2 1211. In the example shown, histogram 1201 is a histogram of soft level voltage (x-axis) versus number of cells read at that voltage (y-axis).

Figure 12C:
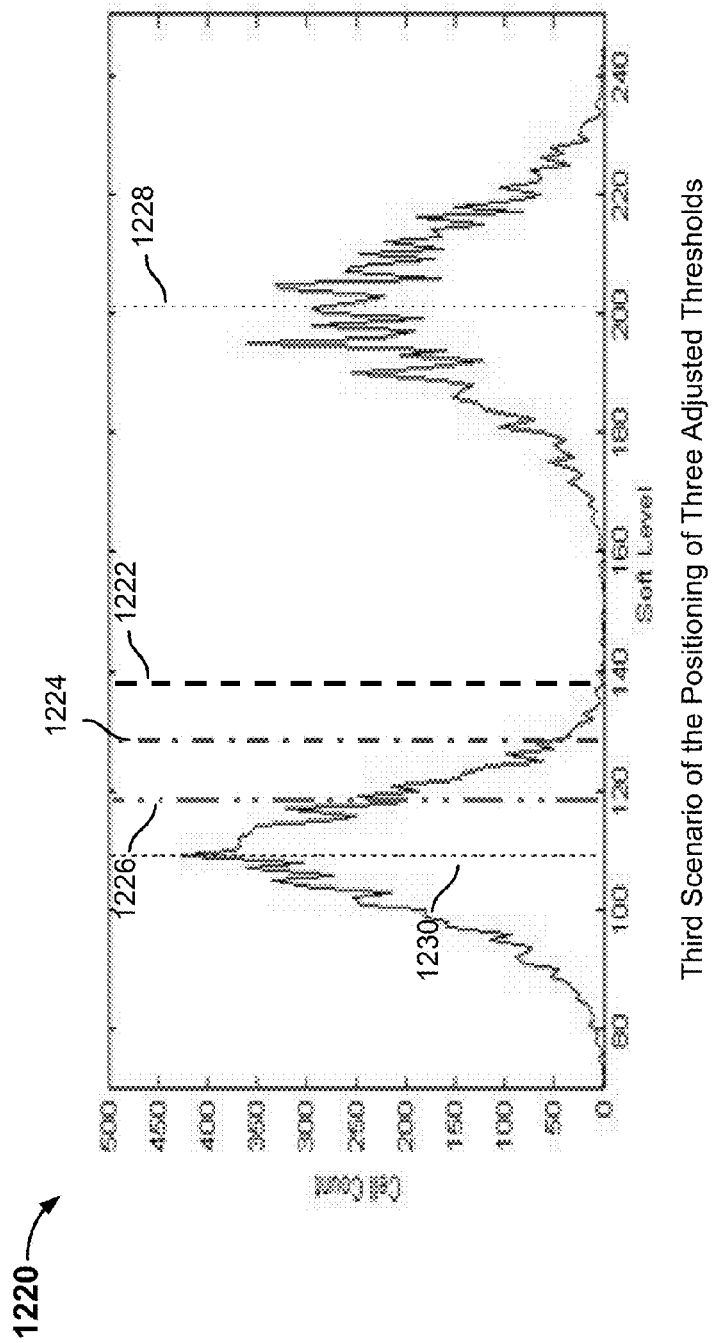
FIG. 12C is a diagram illustrating an embodiment of a histogram of a third scenario of the positioning of three adjusted thresholds.

FIG. 12C is a diagram illustrating an embodiment of a histogram of a third scenario of the positioning of three adjusted thresholds. In the example shown, histogram 1220 is shown to include default threshold voltage 1222 (dash line), first determined and modified threshold voltage 1224 (dash dot line), second determined and modified threshold voltage 1226 (dash dot dot line), mean of distribution of level 3 1228, and mean of distribution of level 2 1230. In the example shown, histogram 1200 is a histogram of soft level voltage (x-axis) versus number of cells read at that voltage (y-axis).

Without loss of generality, in the following description of a process for fast threshold adjustment and error recovery for flash memory, the projective reads with respect to $T_3$ are considered. However, in various embodiments, the process can be applied to any other appropriate threshold. To facilitate the illustration, histogram 1100 of FIG. 11 of a page after 10 hours bake is used. To further facilitate the illustration, histograms 1200, 1201, and 1210 of FIGS. 12A, 12B, and 12C, respectively, are used.

Figure 13:
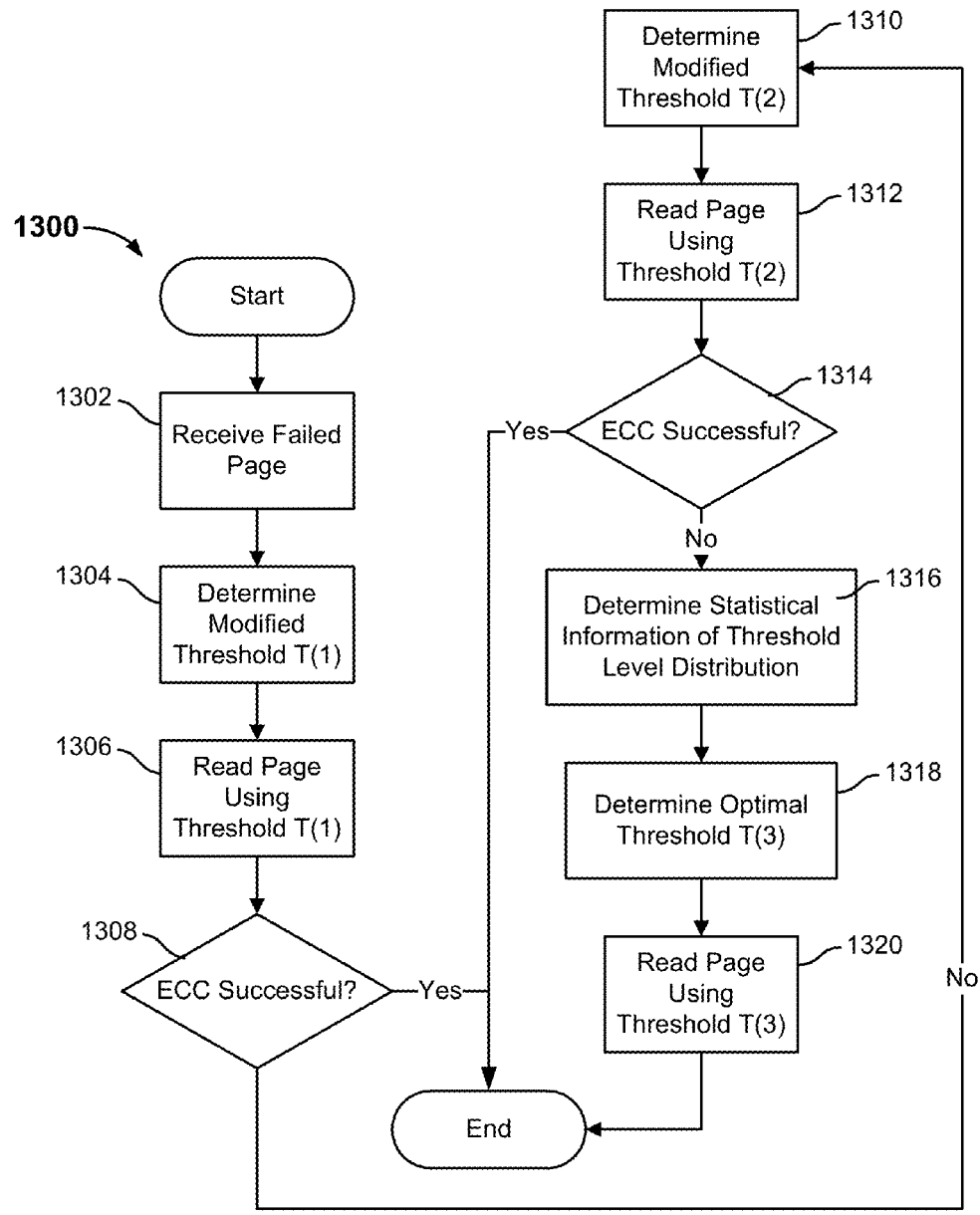
FIG. 13 is a flow diagram illustrating an embodiment of a process for fast error recovery.

FIG. 13 is a flow diagram illustrating an embodiment of a process for fast error recovery for flash memory. In some embodiments, the process of FIG. 13 is used to implement process step 906 and/or 908 of FIG. 9. In the example shown, in 1302, a failed page is received. In some embodiments, the failed page is received following an unsuccessful first read using a default threshold voltage.

In 1304, a first modified threshold voltage is determined. For example, a first modified threshold voltage $T_3^{(1)}$ is determined based at least in part on the following equation:

$$T_3^{(1)} = T_3^{def} - \delta(T_3^{def} - T_2^{def})$$

where $0 < \delta < 0.5$.

In 1306, the failed page is read using the first modified threshold voltage (e.g., $T_3^{(1)}$). In 1308 it is determined whether the failed page is read successfully. In the event that the failed page is read successfully, the process ends. In the event that the failed page is not read successfully, in 1310, a second modified threshold voltage is determined. For example, a second modified threshold voltage $T_3^{(2)}$ is determined based at least in part on the following equation:

$$T_3^{(2)} = T_3^{def} - 2\delta(T_3^{def} - T_2^{def})$$

where $0 < \delta < 0.5$.

In various embodiments, there are three scenarios as shown in FIGS. 12A-C. In some embodiments, the first scenario of FIG. 12A is overwhelmingly dominant in data retention mode, whereas the second scenario of FIG. 12B is most common in fresh data. In some embodiments, the third scenario of FIG. 12C rarely occurs, and is analytically similar to the first scenario of FIG. 12A. It is therefore plausible to additionally assume that $T_3^{(2)}$ does not cross the mean boundary (e.g., mean of distribution of level 2 1210 of FIG. 12A).

In 1312, the failed page is read using the second modified threshold voltage $T_3^{(2)}$. In 1314 it is determined whether the failed page is read successfully. In the event that the failed page is read successfully, the process ends. In the event that the failed page is not read successfully, in 1316, statistical information of distribution(s) of level(s) is/are determined. In some embodiments, statistical information comprises means, standard deviations, fraction of bit flips, or any other appropriate statistical information.

In some embodiments, statistical information such as fraction of bit flips, means, and/or standard deviations of distributions of levels are determined based at least in part on the first three reads using the default or initial threshold voltage, first modified threshold voltage, and second modified threshold voltage. In some embodiments, a third modified desirable and optimal threshold voltage is determined based at least in part on the statistical information determined from the first three reads. In some embodiments, the third modified threshold is based at least in part on a comparison of statistical information determined based at least in part on the read using the first modified threshold voltage and the read using the second modified threshold voltage.

In 1318, a third modified threshold voltage is determined based at least in part on the determined statistical information associated with the distribution(s) of level(s). In some embodiments, the third modified threshold voltage is a projected desirable threshold voltage. For example, a projected desirable threshold voltage $T_3^{(3)}$ is determined, where $T_3^{(3)}$ is further based at least in part on prior read(s) of a scenario (e.g., the scenarios as shown in FIGS. 12A-C). In 1320, the failed page is read using the third modified threshold voltage.

In the following examples, $\Delta_1$ and $\Delta_2$ are known quantities and statistical information representing the fraction of zeros being flipped to ones with respect to and based at least in part on reads using new modified first and second threshold voltages $T_3^{(1)}$ and $T_3^{(2)}$, respectively.

In some embodiments, the division of the three scenarios shown in FIGS. 12A-C is considered based at least in part on $\Delta_1$ and $\Delta_2$. In this example, it is assumed that the first scenario corresponding to FIG. 12A occurs in the event that $$\frac{\Delta_1}{\Delta_2} \geq 2,$$

the second scenario corresponding to FIG. 12B corresponds to the opposite case $$\frac{\Delta_1}{\Delta_2} \leq \frac{1}{2},$$

and the third scenario corresponding to FIG. 12C corresponds to the middle-ground case where $$\frac{1}{2} \leq \frac{\Delta_1}{\Delta_2} < 2.$$

With regard to the first scenario shown in FIG. 12A and the projective read with respect to $T_3$, a third modified desirable threshold voltage $T_3^{(3)}$ is projected and determined based at least in part on the first three reads (e.g., $T_3^{def}$, $T_3^{(1)}$, and $T_3^{(2)}$ in the first scenario shown in FIG. 12A. It is observed that the integration between $T_3^{def}$ and $T_3^{(1)}$ is the fraction of zeros (with respect to $T_3^{def}$) that are changed to ones (with respect to $T_3^{(1)}$). Likewise, the integration between $T_3^{(1)}$ and $T_3^{(2)}$ is the fraction of zeros (with respect to $T_3^{(1)}$ that are changed to ones (with respect to $T_3^{(2)}$). The following are obtained based at least in part on an assumption of a Gaussian distribution of level 3 (with unknown mean $\mu_3$ and variance $\sigma_3^2$):

$$\int_{T_3^{(1)}}^{T_3^{def}} \frac{1}{\sqrt{2\pi}\,\sigma_3} e^{-\frac{(x-\mu_3)^2}{2\sigma_3^2}} dx = \Delta_1$$

$$\int_{T_3^{(2)}}^{T_3^{(1)}} \frac{1}{\sqrt{2\pi}\,\sigma_3} e^{-\frac{(x-\mu_3)^2}{2\sigma_3^2}} dx = \Delta_2$$

where $\Delta_1$ and $\Delta_2$ are known quantities and represent the fraction of zeros being flipped to ones with respect to new modified threshold voltages $T_3^{(1)}$ and $T_3^{(2)}$, respectively. In some embodiments, $\Delta_1$ and $\Delta_2$ are known quantities based at least in part on a read using a default threshold, a read using a first modified threshold, and a read using a second modified threshold. Equivalently, $$\int_{\frac{T_3^{(1)}-\mu_3}{\sigma_3}}^{\frac{T_3^{def}-\mu_3}{\sigma_3}} \frac{1}{\sqrt{2\pi}} e^{-\frac{x^2}{2}} dx = \Delta_1$$

$$\int_{\frac{T_3^{(2)}-\mu_3}{\sigma_3}}^{\frac{T_3^{(1)}-\mu_3}{\sigma_3}} \frac{1}{\sqrt{2\pi}} e^{-\frac{x^2}{2}} dx = \Delta_2$$

In some embodiments, the following approximations are made:

$$\int_{\frac{\mu_3-T_3^{def}}{\sigma_3}}^{\infty} \frac{1}{\sqrt{2\pi}} e^{-\frac{x^2}{2}} dx \approx \Delta_1\left(1 + \frac{\Delta_2}{\Delta_1} + \left(\frac{\Delta_2}{\Delta_1}\right)^2 + \ldots\right) = \frac{\Delta_1^2}{\Delta_1 - \Delta_2}$$

$$\int_{\frac{\mu_3-T_3^{(1)}}{\sigma_3}}^{\infty} \frac{1}{\sqrt{2\pi}} e^{-\frac{x^2}{2}} dx \approx \Delta_2\left(1 + \frac{\Delta_2}{\Delta_1} + \left(\frac{\Delta_2}{\Delta_1}\right)^2 + \ldots\right) = \frac{\Delta_1 \Delta_2}{\Delta_1 - \Delta_2}$$

It is observed that the above two equations are exactly the standard Q function and can be solved utilizing a lookup table. Accordingly, the two unknowns, $\mu_3$ and $\sigma_3$ have been solved.

In some embodiments, the above does not provide any analytical information with regard to the Gaussian distribution of level 2. In fact, the first scenario as shown in FIG. 12A does not reveal useful information regarding level 2. Therefore, it is not possible to determine the optimal threshold.

In some embodiments, a suboptimal method is used. It is first assumed that a sector of a flash memory is correctable with the optimal threshold (otherwise, it fails regardless). In some embodiments, a sector comprises a fraction of a page. Assuming that the data is randomized, it can be roughly approximated that a quarter of data is located at level 3. In order for the sector to be correctable, the desired threshold voltage $T_3^{(3)}$ must be placed beyond the point which results in the number of errors to be a quarter of the error correction capability, e.g., $$\int_{\frac{\mu_3-T_3^{(3)}}{\sigma_3}}^{\infty} \frac{1}{\sqrt{2\pi}} e^{-\frac{x^2}{2}} dx = \frac{t_{ecc}}{4n}$$

where $t_{ecc}$ denotes the error correction capability and n denotes the codeword length. In various embodiments, n denotes the number of cells in a codeword, or any other appropriate value.

In the second scenario corresponding to FIG. 12B, it is not feasible to ignore one distribution while solving the other one, which renders an under-determined system (e.g., with unknowns of two means and two variances). However, it is observed that the optimal threshold must be between $T_3^{(1)}$ and $T_3^{(2)}$ if $$1 \le \frac{\Delta_1}{\Delta_2} < 2,$$

or between $T_3^{(1)}$ and $T_3^{(def)}$ if $$\frac{1}{2} < \frac{\Delta_1}{\Delta_2} < 1.$$

$T_3^{(3)}$ is determined based at least in part on the following:

$$T_3^{(3)} = \left(2 - \frac{\Delta_1}{\Delta_2}\right) T_3^{(1)} + \left(\frac{\Delta_1}{\Delta_2} - 1\right) T_3^{(2)}, \text{ if } 1 \le \frac{\Delta_1}{\Delta_2} < 2$$

$$T_3^{(3)} = \left(2 - \frac{\Delta_2}{\Delta_1}\right) T_3^{(1)} + \left(\frac{\Delta_2}{\Delta_1} - 1\right) T_3^{def}, \text{ if } 1 \le \frac{\Delta_2}{\Delta_1} < 2$$

In some embodiments, the above formulation follows the principle of $T_3^{(3)}$ and $T_3^{(1)}$ in the event that $\Delta_1 = \Delta_2$, which is optimal when the two variances are identical.

In some embodiments, the distribution of level 0 (the erasure level) can be appropriately modeled by the Dirac delta function, rendering $T_1 = 0$ the optimal solution.

In some embodiments, when a fast error recovery process is considered, the occurrences of the second and third scenarios corresponding to the scenarios shown in FIG. 12B and FIG. 12C, respectively, are ignored (which is shown to be valid experimentally), and it is further assumed that the variances of levels 1, 2, and 3 are equal (denoted by $\sigma^2$) and satisfy:

$$\int_{\frac{42.5}{\sigma}}^{\infty} \frac{1}{\sqrt{2\pi}} e^{-\frac{x^2}{2}} dx = \frac{t_{ecc}}{4n}$$

where the constant term 42.5 =255/6 follows the assumption that all three (two-sided) Gaussian distributions are equally located over the space [1,255] and the term $$\frac{t_{ecc}}{4n}$$

on the right side assumes the codeword to be the worst-case correctable. Subsequently, the mean of the Gaussian distribution of level 3 (and likewise, that of level 2) is determined by the following approximation:

$$\int_{\frac{\mu_3-T_3^{def}}{\sigma}}^{\infty} \frac{1}{\sqrt{2\pi}} e^{-\frac{x^2}{2}} dx \approx \int_{\frac{\mu_3-T_3^{def}}{\sigma}}^{\frac{\mu_3-T_3^{(1)}}{\sigma}} \frac{1}{\sqrt{2\pi}} e^{-\frac{x^2}{2}} dx = \Delta$$

where $\mu_3 > T_3^{def}$ by assumption. Furthermore, the above approximation can be significantly improved by one round of iteration. Specifically, in the event that $\mu_3^{(1)} = \mu_3$ is let to be the value obtained from the above approximation, then $\mu_3^{(2)}$ is determined via:

$$\int_{\frac{\mu_3^{(2)}-T_3^{def}}{\sigma}}^{\infty} \frac{1}{\sqrt{2\pi}} e^{-\frac{x^2}{2}} dx =$$

$$\int_{\frac{\mu_3^{(2)}-T_3^{def}}{\sigma}}^{\frac{\mu_3^{(2)}-T_3^{(1)}}{\sigma}} \frac{1}{\sqrt{2\pi}} e^{-\frac{x^2}{2}} dx + \int_{\frac{\mu_3^{(2)}-T_3^{(1)}}{\sigma}}^{\infty} \frac{1}{\sqrt{2\pi}} e^{-\frac{x^2}{2}} dx \approx$$

$$\int_{\frac{\mu_3-T_3^{def}}{\sigma}}^{\frac{\mu_3-T_3^{(1)}}{\sigma}} \frac{1}{\sqrt{2\pi}} e^{-\frac{x^2}{2}} dx + \int_{\frac{\mu_3^{(1)}-T_3^{(1)}}{\sigma}}^{\infty} \frac{1}{\sqrt{2\pi}} e^{-\frac{x^2}{2}} dx =$$

$$\Delta + \int_{\frac{\mu_3^{(1)}-T_3^{(1)}}{\sigma}}^{\infty} \frac{1}{\sqrt{2\pi}} e^{-\frac{x^2}{2}} dx$$

where in some embodiments, the value of the last term is obtained through a lookup table.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for error recovery for flash memory, comprising:
   a receiver configured to:
   receive an indication associated with an error-correcting code (ECC) decoding failure related to data stored on a page of flash memory;
   identify a logical type of the page, including by determining a bit type associated with the page;
   adjust a threshold based at least in part on the logical type, including by:
   in the event it is determined the bit type associated with the page is a most significant bit (MSB), adjusting one or more MSB read thresholds; and in the event it is determined the bit type associated with the page is a least significant bit (LSB), adjusting one or more LSB read thresholds; and read the page using the adjusted threshold, including by:

in the event it is determined the bit type associated with the page is a MSB, reading the page using the one or more adjusted MSB read thresholds; and in the event it is determined the bit type associated with the page is a LSB, reading the page using the one or more adjusted LSB read thresholds; and an interface coupled to the receiver.

2. A system as recited in claim 1, wherein the threshold is adjusted iteratively.

3. A system as recited in claim 1, wherein the receiver is configured to adjust the threshold based at least in part on statistical information associated with a distribution of a threshold level.

4. A system as recited in claim 3, wherein statistical information comprises one or more of the following: a fraction of bit flips, a mean, and a standard deviation.

5. A system as recited in claim 4, wherein a mean and a standard deviation are determined based at least in part on a Q-function.

6. A system as recited in claim 3, wherein the distribution is modeled using a Gaussian distribution.

7. A system as recited in claim 1, wherein the adjusted threshold is determined based at least in part on error correction capability and a codeword length.

8. A system as recited in claim 1, wherein the receiver is configured to adjust further based at least in part on (1) a first value associated with one or more flipped bits associated with a first adjusted read threshold and (2) a second value associated with one or more flipped bits associated with a second adjusted read threshold.

9. A system as recited in claim 8, wherein the first value and the second value include a fraction of flipped bits.

10. A system as recited in claim 8, wherein the receiver is further configured to adjust by comparing (1) a ratio of the first value and the second value and (2) one or more thresholds in order to determine which one of a plurality of ranges the ratio falls into, wherein the receiver is configured to adjust further based at least in part on which one of the plurality of ranges the ratio falls into.

11. A method for error recovery for flash memory, comprising:

receiving an indication associated with an error-correcting code (ECC) decoding failure related to data stored on a page of flash memory;

identifying a logical type of the page, including by determining a bit type associated with the page;

using a processor to adjust a threshold based at least in part on the logical type, including by:

in the event it is determined the bit type associated with the page is a most significant bit (MSB), adjusting one or more MSB read thresholds; and in the event it is determined the bit type associated with the page is a least significant bit (LSB), adjusting one or more LSB read thresholds; and reading the page using the adjusted threshold, including by:

in the event it is determined the bit type associated with the page is a MSB, reading the page using the one or more adjusted MSB read thresholds; and in the event it is determined the bit type associated with the page is a LSB, reading the page using the one or more adjusted LSB read thresholds.

12. A method as recited in claim 11, wherein adjusting the threshold is based at least in part on statistical information associated with a distribution of a threshold level.

13. A method as recited in claim 11, wherein adjusting is further based at least in part on (1) a first value associated with one or more flipped bits associated with a first adjusted read threshold and (2) a second value associated with one or more flipped bits associated with a second adjusted read threshold.

14. A method as recited in claim 13, wherein the first value and the second value include a fraction of flipped bits.

15. A method as recited in claim 13, wherein adjusting further includes comparing (1) a ratio of the first value and the second value and (2) one or more thresholds in order to determine which one of a plurality of ranges the ratio falls into, wherein the receiver is configured to adjust further based at least in part on which one of the plurality of ranges the ratio falls into.

16. A computer program product for error recovery for flash memory, the computer program product being embodied in a non-transitory computer readable storage medium and comprising computer instructions for:

receiving an indication associated with an error-correcting code (ECC) decoding failure related to data stored on a page of flash memory;

identifying a logical type of the page, including by determining a bit type associated with the page;

adjusting a threshold based at least in part on the logical type, including by:

in the event it is determined the bit type associated with the page is a most significant bit (MSB), adjusting one or more MSB read thresholds; and in the event it is determined the bit type associated with the page is a least significant bit (LSB), adjusting one or more LSB read thresholds; and reading the page using the adjusted threshold, including by:

in the event it is determined the bit type associated with the page is a MSB, reading the page using the one or more adjusted MSB read thresholds; and in the event it is determined the bit type associated with the page is a LSB, reading the page using the one or more adjusted LSB read thresholds.

17. A computer program product as recited in claim 16, wherein the computer instructions for adjusting further include computer instructions for adjusting further based at least in part on (1) a first value associated with one or more flipped bits associated with a first adjusted read threshold and (2) a second value associated with one or more flipped bits associated with a second adjusted read threshold.

18. A computer program product as recited in claim 17, wherein the first value and the second value include a fraction of flipped bits.

19. A computer program product as recited in claim 17, wherein the computer instructions for adjusting further include computer instructions for comparing (1) a ratio of the first value and the second value and (2) one or more thresholds in order to determine which one of a plurality of ranges the ratio falls into, wherein the receiver is configured to adjust further based at least in part on which one of the plurality of ranges the ratio falls into.

* * * * *